US007618868B2

(12) United States Patent
Yoo et al.

(10) Patent No.: US 7,618,868 B2
(45) Date of Patent: Nov. 17, 2009

(54) METHOD OF MANUFACTURING FIELD EFFECT TRANSISTORS USING SACRIFICIAL BLOCKING LAYERS

(75) Inventors: Jae-yoon Yoo, Seoul (KR); Young-gun Ko, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 455 days.

(21) Appl. No.: 11/381,481

(22) Filed: May 3, 2006

(65) Prior Publication Data
US 2007/0257318 A1   Nov. 8, 2007

(51) Int. Cl.
*H01L 21/336* (2006.01)
(52) U.S. Cl. .................. 438/303; 438/197; 438/585; 438/595; 257/E21.409
(58) Field of Classification Search ........... 438/197, 438/303, 595
See application file for complete search history.

(56) References Cited

U.S. PATENT DOCUMENTS

| | | | | |
|---|---|---|---|---|
| 5,898,203 | A * | 4/1999 | Yoshitomi et al. ........... 257/344 |
| 6,025,253 | A * | 2/2000 | Sun ............................. 438/585 |
| 6,162,370 | A * | 12/2000 | Hackett et al. ............. 252/79.1 |
| 6,352,885 | B1 * | 3/2002 | Wieczorek et al. .......... 438/197 |
| 6,479,350 | B1 | 11/2002 | Ling et al. |
| 6,492,218 | B1 * | 12/2002 | Mineji ......................... 438/199 |
| 6,946,709 | B2 * | 9/2005 | Yang ............................ 257/371 |
| 7,084,025 | B2 * | 8/2006 | Phua et al. ................... 438/199 |
| 7,176,522 | B2 * | 2/2007 | Cheng et al. ................. 257/338 |
| 7,227,234 | B2 * | 6/2007 | Roizin et al. ................ 257/393 |
| 7,291,534 | B2 * | 11/2007 | Tomita ........................ 438/275 |
| 2002/0000633 | A1 * | 1/2002 | Miyashita .................... 257/500 |

(Continued)

FOREIGN PATENT DOCUMENTS

JP        10163338       6/1998

(Continued)

OTHER PUBLICATIONS

Notice of Allowance for Korean Patent Application No. 9-5-2007-05263396.

*Primary Examiner*—Charles D. Garber
*Assistant Examiner*—Angel Roman
(74) *Attorney, Agent, or Firm*—Myers Bigel Sibley & Sajovec

(57) ABSTRACT

Provided are a more stable semiconductor integrated circuit device and a method of manufacturing the same. The method includes providing a semiconductor substrate comprising a first transistor region having a stacked structure of a first gate insulating layer and a first gate and a second transistor region having a stacked structure of a second gate insulating layer and a second gate, forming a blocking layer in the first transistor region, conformally forming a second oxide layer on lateral surfaces of the second gate insulating layer and the second gate and on an exposed surface of the semiconductor substrate by performing oxidation in the second transistor region, removing the blocking layer of the first transistor region, forming a pre-spacer layer on the entire surface of the semiconductor substrate, forming a first spacer by anisotropically etching the pre-spacer layer of the first transistor region and forming a second spacer by anisotropically etching the second oxide layer and the pre-spacer layer of the second transistor region, and forming source/drain regions in the semiconductor substrate to complete a first transistor and a second transistor.

8 Claims, 14 Drawing Sheets

U.S. PATENT DOCUMENTS

2005/0263826 A1* 12/2005 Yang .................. 257/369
2008/0272437 A1* 11/2008 Doris et al. ............ 257/369

FOREIGN PATENT DOCUMENTS

| JP | 2001-110913 A | 4/2001 |
|----|---------------|--------|
| KR | 1020040001894 A | 1/2004 |
| KR | 1020040002230 A | 1/2004 |
| KR | 1020040059931 A | 7/2004 |
| KR | 1020050065857 A | 6/2005 |

* cited by examiner

METHOD OF MANUFACTURING FIELD EFFECT TRANSISTORS USING SACRIFICIAL BLOCKING LAYERS

BACKGROUND OF THE INVENTION

1. Field of the Invention

The present invention relates to a method of manufacturing a semiconductor integrated circuit device, and a semiconductor integrated circuit device manufactured by the method. More particularly, the present invention relates to a method of manufacturing a semiconductor integrated circuit device that can be more stably operated, and a semiconductor integrated circuit device manufactured by the method.

2. Description of the Related Art

MOS (Metal-Oxide Semiconductor) devices are increasingly miniaturized in response to the desire to increase the integration of semiconductor devices. Channel lengths are reduced to the deep sub-micron level in order to increase an operating speed and current drive capability of the device.

With a reduction in the channel length, depletion regions of a source electrode and a drain electrode penetrate into a channel area, thereby shortening an effective channel length. As a result, a threshold voltage is reduced, thereby leading to a loss of gate controllability in an MOS transistor, which is called a short channel effect. In particular, with the effective channel length reduced, hot carriers are generated, thereby lowering the current drivability and the refresh characteristics, and ultimately deteriorating a reliability of semiconductor devices.

To avoid hot carrier effect and improve the reliability of semiconductor devices, after a gate formation process, a reoxidation process may be performed. However, when the reoxidation process is performed, a thickness of a gate insulating layer may be increased due to a bird's beak phenomenon, resulting in a reduction in the operating speed of a semiconductor device. Thus, the reoxidation process is not suitably employed in the manufacture of fast operating semiconductor devices.

Meanwhile, various types of transistors are present in a semiconductor device unit of a semiconductor integrated circuit device. These transistors require reliability, a fast operating speed, current driving capability, etc., but must satisfy more important characteristics according to their own requirements. For example, some transistors require higher reliability, whereas some transistors require a faster operating speed.

Accordingly, when all transistors are subjected to a reoxidation process to remove a hot carrier effect, characteristic requirements of some transistors may be deteriorated.

SUMMARY OF THE INVENTION

The present invention provides a method of manufacturing a semiconductor integrated circuit device that can be more stably operated.

The present invention also provides a semiconductor integrated circuit device that can be more stably operated.

The above stated objects as well as other objects, features and advantages, of the present invention will become clear to those skilled in the art upon review of the following description.

According to an aspect of the present invention, there is provided a method of manufacturing a semiconductor integrated circuit device, the method including providing a semiconductor substrate comprising a first transistor region having a stacked structure of a first gate insulating layer and a first gate and a second transistor region having a stacked structure of a second gate insulating layer and a second gate, forming a blocking layer in the first transistor region, conformally forming a second oxide layer on lateral surfaces of the second gate insulating layer and the second gate and on an exposed surface of the semiconductor substrate by performing oxidation in the second transistor region, removing the blocking layer of the first transistor region, forming a pre-spacer layer on the entire surface of the semiconductor substrate, forming a first spacer by anisotropically etching a portion of the pre-spacer layer of the first transistor region and forming a second spacer by anisotropically etching the second oxide layer and a portion of the pre-spacer layer of the second transistor region, and forming source/drain regions in the semiconductor substrate to complete a first transistor and a second transistor.

According to another aspect of the present invention, there is provided a method of manufacturing a semiconductor integrated circuit device, the method including providing a semiconductor substrate comprising a first transistor region having a stacked structure of a first gate insulating layer and a first gate and a second transistor region having a stacked structure of a second gate insulating layer and a second gate, forming a blocking layer in the first transistor region, conformally forming a second oxide layer on lateral surfaces of the second gate insulating layer and the second gate and on an exposed surface of the semiconductor substrate by performing oxidation in the second transistor region, forming a first spacer by anisotropically etching the blocking layer of the first transistor region, and forming a second spacer by anisotropically etching the second oxide layer of the second transistor region, and forming source/drain regions in the semiconductor substrate to complete a first transistor and a second transistor.

According to still another aspect of the present invention, there is provided a semiconductor integrated circuit device including a semiconductor substrate in which a first transistor region and a second transistor region are defined, a first transistor, disposed in the first transistor region, comprising a source/drain region, a first gate insulating layer, a first gate disposed on the first gate insulating layer, and a first spacer disposed on a lateral surface of the first gate, and a second transistor, disposed in the second transistor region, comprising a source/drain region, a second gate insulating layer, a second gate disposed on the second gate insulating layer, and a second spacer, disposed on a lateral surface of the second gate, having a greater width than the first spacer.

According to a further aspect of the present invention, there is provided a semiconductor integrated circuit device including a semiconductor substrate in which a first transistor region and a second transistor region are defined, a first transistor, disposed in the first transistor region, comprising a source/drain region, a first gate insulating layer, a first gate disposed on the first gate insulating layer, and a first spacer disposed on a lateral surface of the first gate, and a second transistor, disposed in the second transistor region, comprising a source/drain region, a second gate insulating layer, a second gate disposed on the second gate insulating layer, and a second spacer, disposed on a lateral surface of the second gate, having a smaller width than the first spacer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
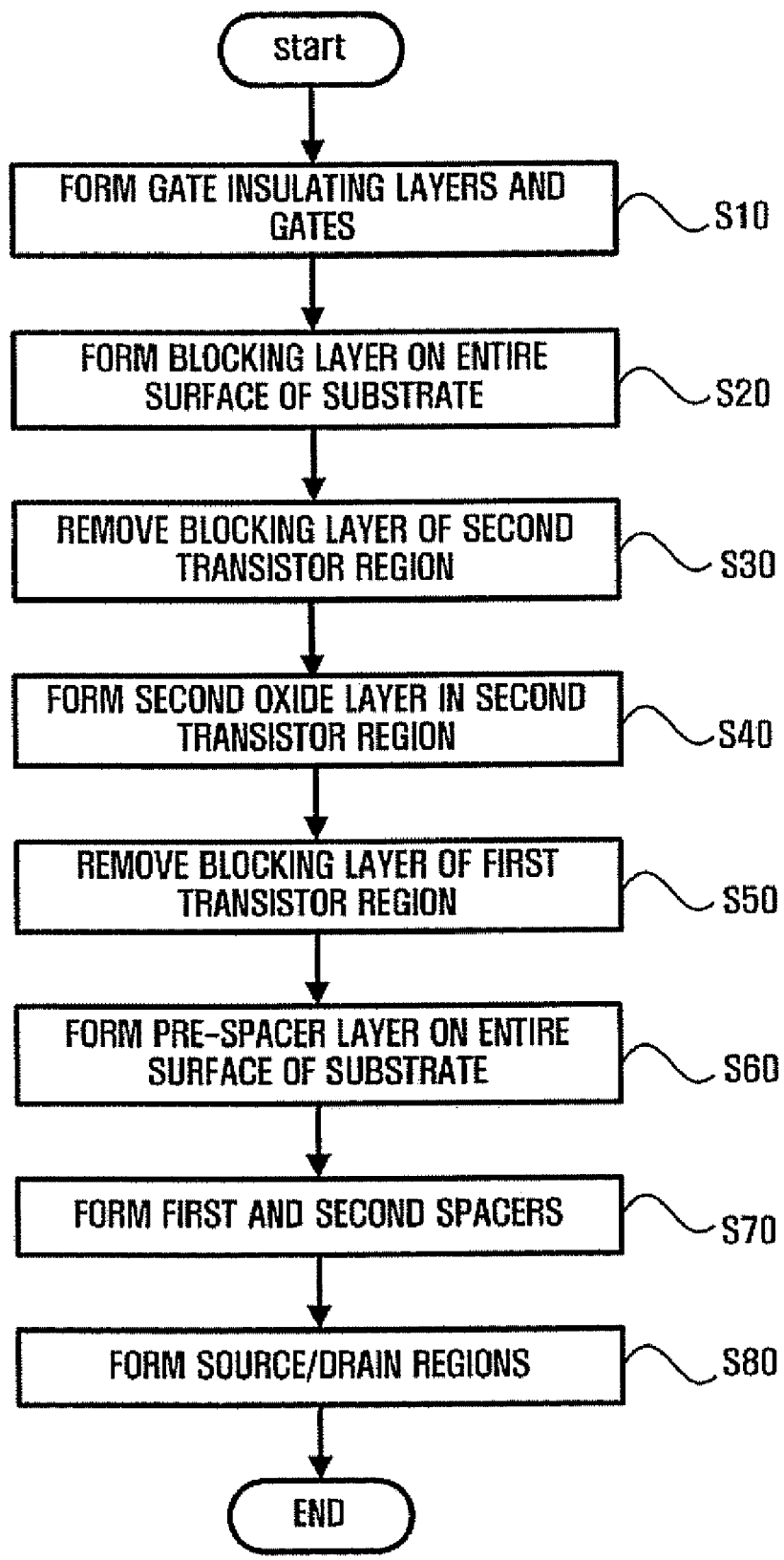
FIG. 1 is a flow diagram illustrating a method of manufacturing a semiconductor integrated circuit device according to a first embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Hereinafter, a method of manufacturing a semiconductor integrated circuit device according to a first embodiment of the present invention will be described with reference to FIGS. 1 through 9.

FIG. 1 is a flow diagram illustrating a method of manufacturing a semiconductor integrated circuit device according to a first embodiment of the present invention, and FIGS. 2 through 9 are sequential sectional views illustrating the method of manufacturing the semiconductor integrated circuit device according to the first embodiment of the present invention.

Here, a substrate 100 is divided into a first transistor region and a second transistor region labeled "A" and "B" shown in the drawings, respectively.

Figure 2:
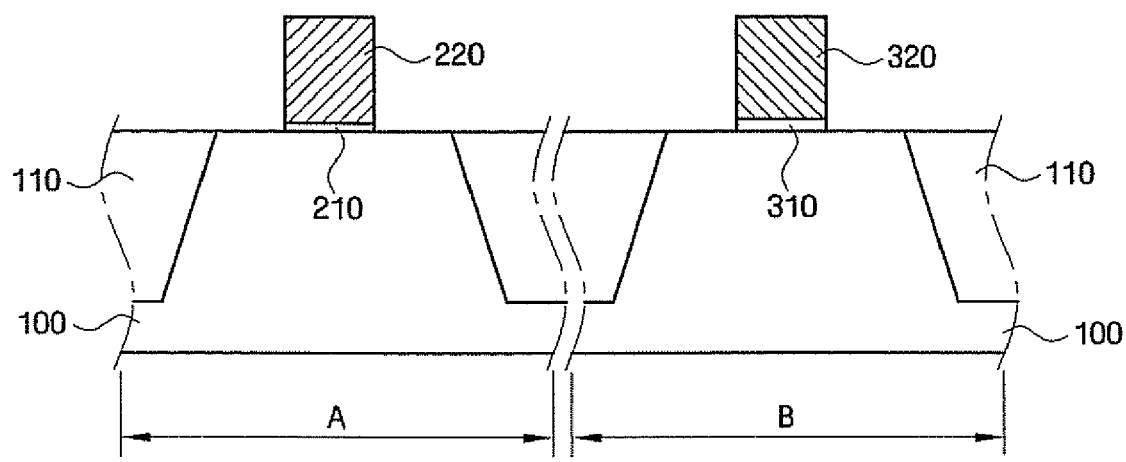
FIGS. 2 through 9 are sequential sectional views illustrating the method of manufacturing the semiconductor integrated circuit device according to the first embodiment of the present invention.

Referring first to FIGS. 1 and 2, first and second gate insulating layers 210 and 310 and first and second gates 220 and 320 are formed on the substrate 100 in operation S10.

In detail, the substrate 100 is divided into an active region and an inactive region by a device isolation film 10 such as Shallow Trench Isolation (STI) or Field OXide (FOX). Then, the first gate insulating layer 210 and the first gate 220 are formed on a top surface of the substrate 100 corresponding to the first transistor region A, and the second gate insulating layer 310 and the second gate 320 are formed on a top surface of the substrate 100 corresponding to the second transistor region B. The gate insulation layers 220 and 320 may be formed of silicon oxide (SiOx) or silicon oxynitride (SiON). The gate insulation layers 220 and 320 may be formed of silicon oxide (SiOx) or silicon oxynitride (SiON). The first and second gates 220 and 320 are conductors, which may comprise doped polysilicon, a metal layer, or other material layer when necessary. Here, the first and second gates 220 and 320 may be made of the same material or different materials according to properties of the first and second transistors 200 and 300. The first and second gates 220 and 320 are conductors, which may comprise doped polysilicon, a metal layer, or other material layer when necessary. Here, the first and second gates 220 and 320 may be made of the same material or different materials according to properties of the first and second transistors 200 and 300.

Figure 3:
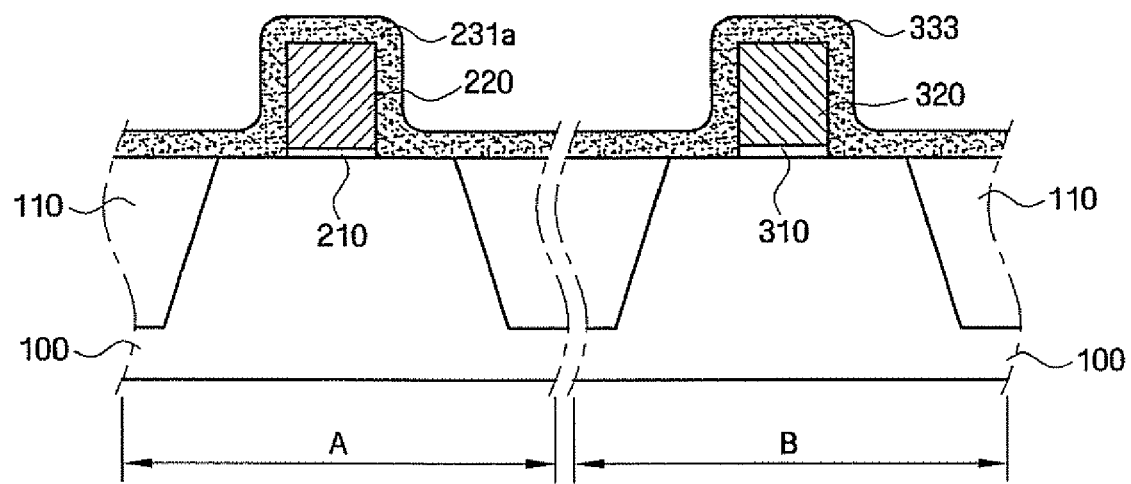

Next, referring to FIGS. 1 and 3, a blocking layer 231a, 333 is formed on the entire surface of the substrate 100 in operation S20. In detail, the blocking layer 231a, 333 is formed over an exposed surface of the substrate 100 and the first and second gates 220 and 320. The blocking layer 231a, 333 may be, for example, a nitride layer or a stacked layer of a nitride layer and an oxide layer, and may be formed to a thickness of approximately 100-500 Å.

Figure 4:
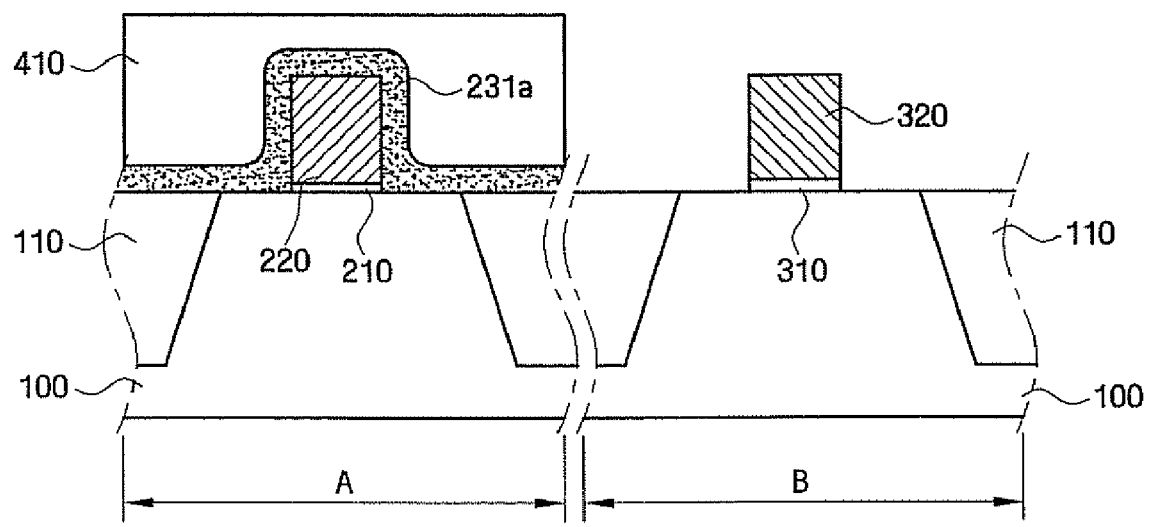

Next, referring to FIGS. 1 and 4, the blocking layer (see 333 of FIG. 3) formed on the second transistor region B is removed in operation S30. In detail, the first and second transistor regions A and B are entirely covered with photoresist 410 and a portion of the photoresist 410 of the second transistor region B is removed. Then, the blocking layer 333 formed on the second transistor region B is removed using a portion of the photoresist 410 of the first transistor region A as an etching mask. At this time, the blocking layer 333 formed on the second transistor region B can be removed using a low-temperature phosphoric acid strip process, or a no-bias-ion-etching process. Then, the portion of the photoresist 410 of the first transistor region A is removed.

Figure 5:
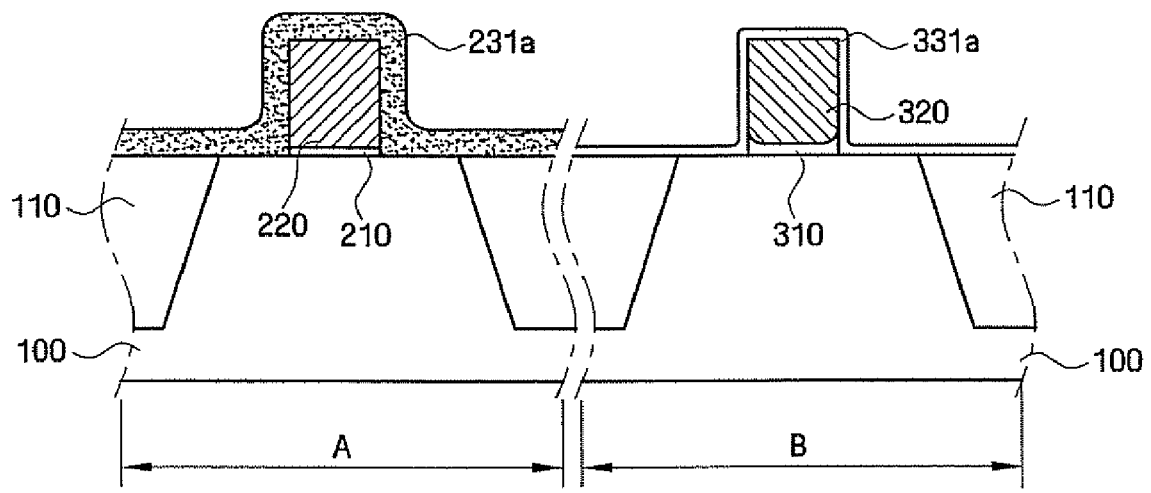

In operation S40, referring to FIGS. 1 and 5, a second oxide layer 331a is conformally formed on the top and lateral surfaces of the second gate 320, on the lateral surface of the second gate insulating layer 310, and on an exposed surface of the substrate 100. The second oxide layer 331a may be formed by performing thermal oxidation at a temperature of about 700~1,000° C. in the course of furnace process. Alternatively, the second oxide layer 331a may be formed by performing rapid thermal oxidation at a temperature of about 800~1,100° C. in the course of rapid thermal process (RTP). In this case, the thermal oxidation may be an oxidation process such as dry oxidation, wet oxidation, or radical oxidation, or a combination of the oxidation process with a nitridation process such as thermal nitridation or plasma nitridation.

Here, only the second transistor region B is subjected to an oxidation. That is, the second transistor region B requiring an oxidation process is selectively oxidized, whereas the first transistor region A requiring no oxidation process is not oxidized.

The second oxide layer 331a may be formed to a thickness of about 20~70 Å. When thermal oxidation is carried out, the second oxide layer 331a is conformally formed on top and lateral surfaces of the second gate 320, on the lateral surface of the second gate insulating layer 310, and on the exposed surface of the substrate 100. At this time, either end of the second gate insulating layer 310 is formed to be thicker than the central portion thereof due to oxidation. That is, either end of the second gate insulating layer 310 has a slightly upwardly rising shape. However, a thickness of the central portion of the second gate insulating layer 310 is maintained at a uniform level.

Figure 6:
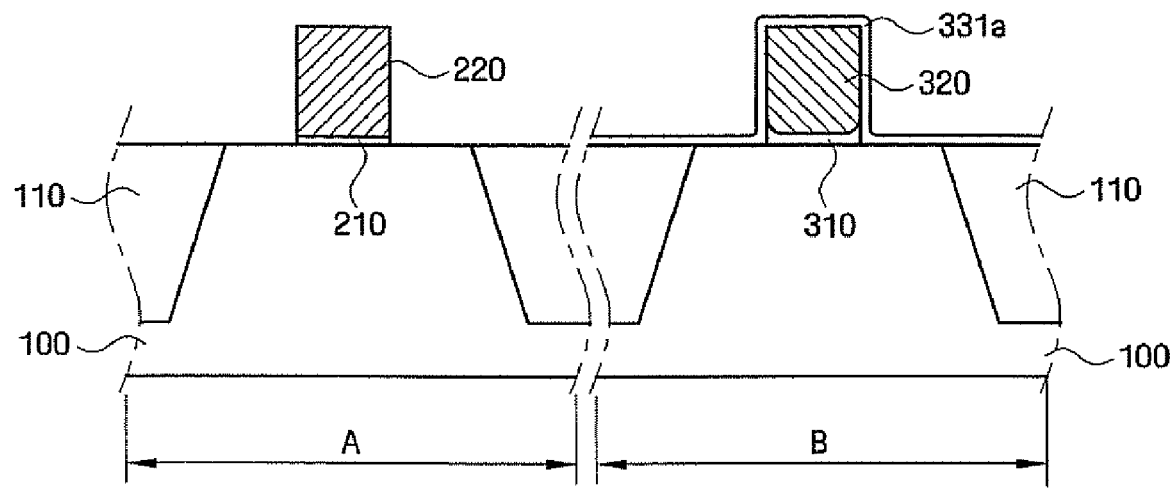

Next, referring to FIGS. 1 and 6, the blocking layer (see 231a of FIG. 5) formed on the first transistor region A is removed in operation S50.

Figure 7:
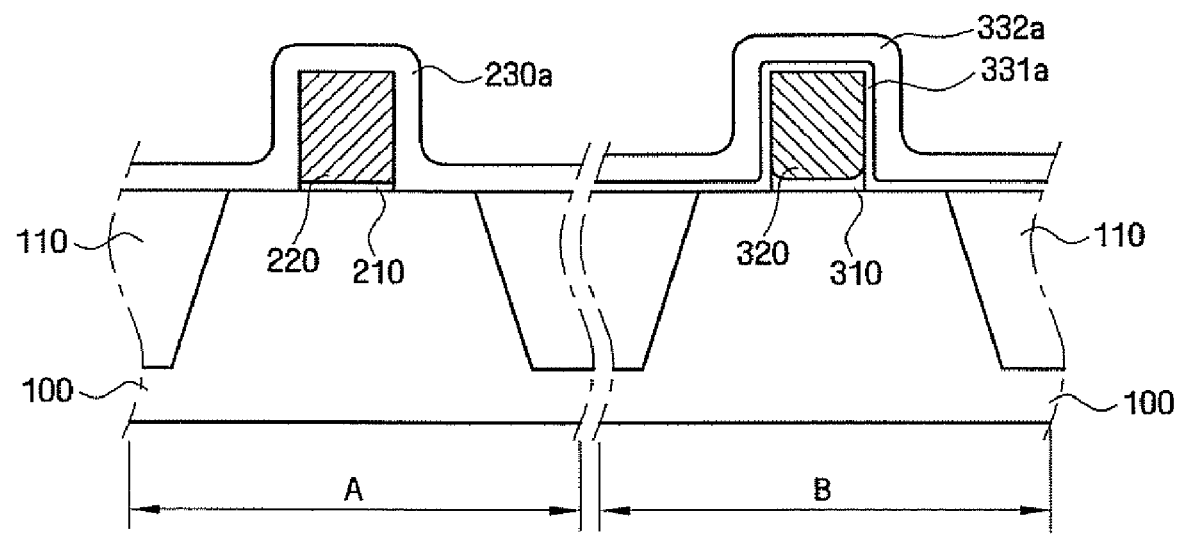

Next, referring to FIGS. 1 and 7, a pre-spacer layer 230a, 332a is formed on the entire surface of the substrate 100 in operation S60. For example, the pre-spacer layer may be formed by, for example, chemical vapor deposition (CVD) and may be a nitride layer or an oxide layer.

Figure 8:
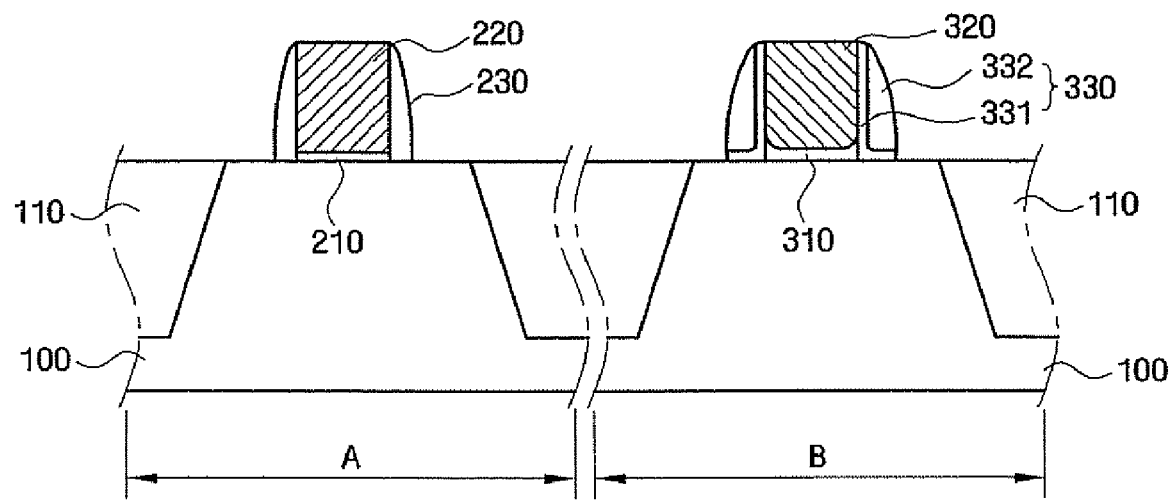

Next, referring to FIGS. 1 and 8, first and second spacers 230 and 330 are respectively formed in the first and second transistor regions A and B in operation S70. That is to say, the pre-spacer layer (see 230a of FIG. 7) formed on the first transistor region A is anisotropically etched to form the first spacer 230, and the second oxide layer 331a and the pre-spacer layer 332a formed on the second transistor region B are anisotropically etched to form the second spacer 330.

A width of the second spacer 330 is greater than a width of the first spacer 230, and the second spacer 330 has a double-layered structure comprised of an inner spacer 331 and an outer spacer 332 The inner spacer 331 is formed thinly along the lateral surface of the second gate 320 and extends toward a top surface of the substrate 100 corresponding to the second transistor region B, and the outer spacer 332 is formed on the lateral surface of the inner spacer 331 by anisotropically etching the pre-spacer layer 332a made of an oxide or a nitride so that a width of an upper portion of the outer spacer 332 is smaller than that of a lower portion of the outer spacer 332.

Figure 9:
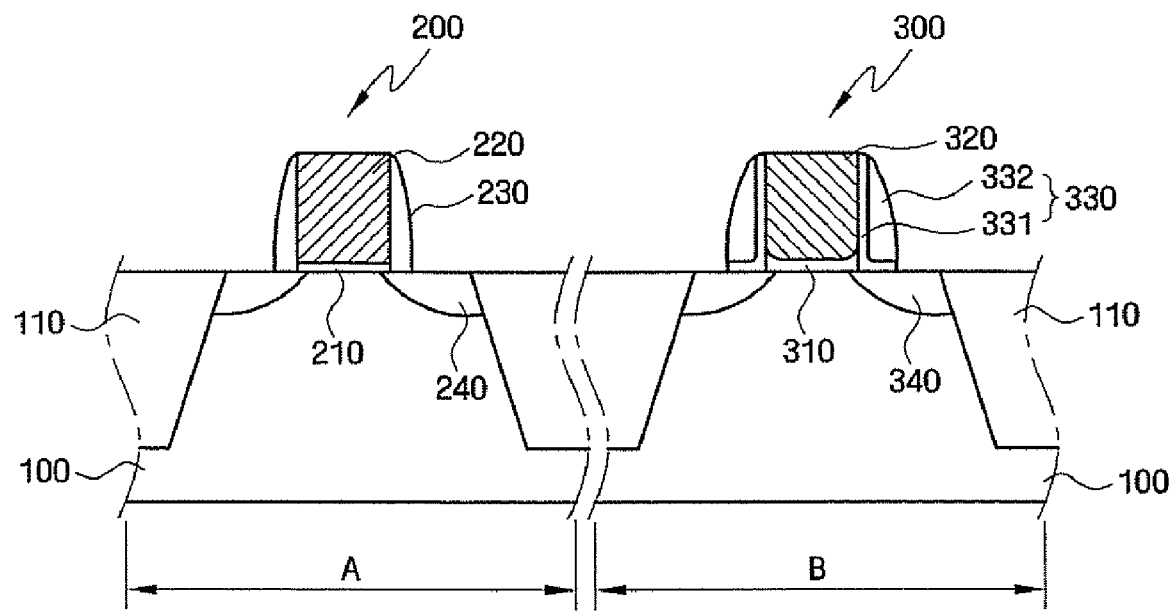

Next, referring to FIGS. 1 and 9, source/drain regions 240 and 340 are formed to complete a first transistor 200 and a second transistor 300 in operation S80. In detail, impurities are injected into active regions of the substrate 100 to form the source/drain regions 240 and 340. At this time, in the case of forming an NMOS transistor, high-concentration impurities, e.g., arsenic (As), phosphorus (P) or the like, are implanted using an ion implantation energy of several tens keV. On the other hand, in the case of forming a PMOS transistor, high-concentration impurities, e.g., boron (B) or the like, are implanted using an ion implantation energy of several tens keV.

According to the method of the above-illustrated first embodiment of the present invention, when the semiconductor substrate 100 is divided into the first transistor region A requiring no reoxidation process and the second transistor region B requiring a reoxidation process, and only the second transistor region B is subjected to a reoxidation process, the characteristics of transistors can be satisfied according to their own requirements of the transistors. That is, in the second transistor region B having the second transistor 300 requiring improved reliability, a hot carrier effect can be avoided by forming the inner spacer 331 by oxidation may be formed by a reoxidation process, thereby ensuring better reliability.

Alternatively, in order to prevent an increase in the threshold voltage or a decrease in the operating speed due to a reoxidation process, no reoxidation process may be performed on the first transistor region A having transistors requiring a fast operating speed and thus requiring no reoxidation process, allowing transistors of a semiconductor integrated circuit device to be most appropriately tailored to their own requirements. That is, the semiconductor integrated circuit device having individual transistors implemented most suitably according to their own requirements can be manufactured in a more stable, highly efficient manner.

Furthermore, although the second transistor region B is subjected to a reoxidation process, the thicknesses of both ends of a second gate insulating layer are slightly increased and the central portion of the second gate insulating layer has a uniform, thin thickness by appropriately controlling processing conditions. Therefore, a reduction in the operating speed due to an increase in the thickness of a gate insulating layer can be solved.

Hereinafter, an exemplary semiconductor integrated circuit device according to the first embodiment of the present invention will be described with reference to FIG. 9.

Referring to FIG. 9, a first transistor 200 is present in the first transistor region A and a second transistor 300 is present in the second transistor region B.

Here, the first transistor 200 and the second transistor 300 are transistors having different characteristics. For example, the first transistor 200 and the second transistor 300 may be different in terms of operating speed or dimensions. In addition, the first transistor 200 and the second transistor 300 may be different in terms of a gate material. FIG. 9 illustrates that the first transistor 200 and the second transistor 300 are different in terms of the thickness of a gate insulating layer.

The first transistor 200 includes a first gate insulating layer 210 with a uniform film thickness, a first gate 220 disposed on the first gate insulating layer 210, a first spacer 230 disposed on the lateral surface of the first gate 220, and a source/drain region 240.

The second transistor 300 includes a second gate insulating layer 310, a second gate 320 disposed on the second gate insulating layer 310, a second spacer 330 disposed on the lateral surface of the second gate 320, and a source/drain region 340.

Here, both ends of the second gate insulating layer 310 are thicker than the central portion. That is, both the ends of the second gate insulating layer 310 have a slightly upwardly rising shape. FIG. 9 illustrates that the second gate insulating layer 310 is thicker than the first gate insulating layer 210, but the present invention is not limited to the above-illustrated example. Rather, the thicknesses of the first gate insulating layer 210 and the second gate insulating layer 310 may vary according to characteristics of the first transistor 200 and the second transistor 300.

A width of the second spacer 330 disposed on the lateral surface of the second gate 320 is greater than that of the first spacer 230 disposed on the lateral surface of the first gate 220. In greater detail, the second spacer 330 has a double-layered structure. That is, the second spacer 330 is comprised of the inner spacer 331 formed thinly along the lateral surface of the second gate 320 and extended toward a top surface of the substrate 100 corresponding to the second transistor region B and the outer spacer 332, i.e., an oxide/nitride layer, formed on an external surface of the inner spacer 331, as described above. Thus, the width of an upper portion of the oxide/nitride layer 332 is smaller than that a lower portion of the oxide/nitride layer 332.

A hot carrier effect can be avoided by forming the inner spacer 331 by oxidation only in the second transistor region B, thereby improving the reliability of the second transistor 300. On the other hand, the first transistor 200 of the first transistor region A does not undergo a change in the thickness of the first gate insulating layer 210 nor an increase in the threshold voltage through a reoxidation process, thereby ensuring better characteristics, such as a faster operating speed, or the like.

That is, the first transistor 200 and the second transistor 300 individually satisfy their own requirements, thereby enhancing the stability and performance of a semiconductor integrated circuit device.

Hereinafter, a method of manufacturing the semiconductor integrated circuit device according to the second embodiment of the present invention will be described with reference to FIGS. 10 through 12.

Figure 10:
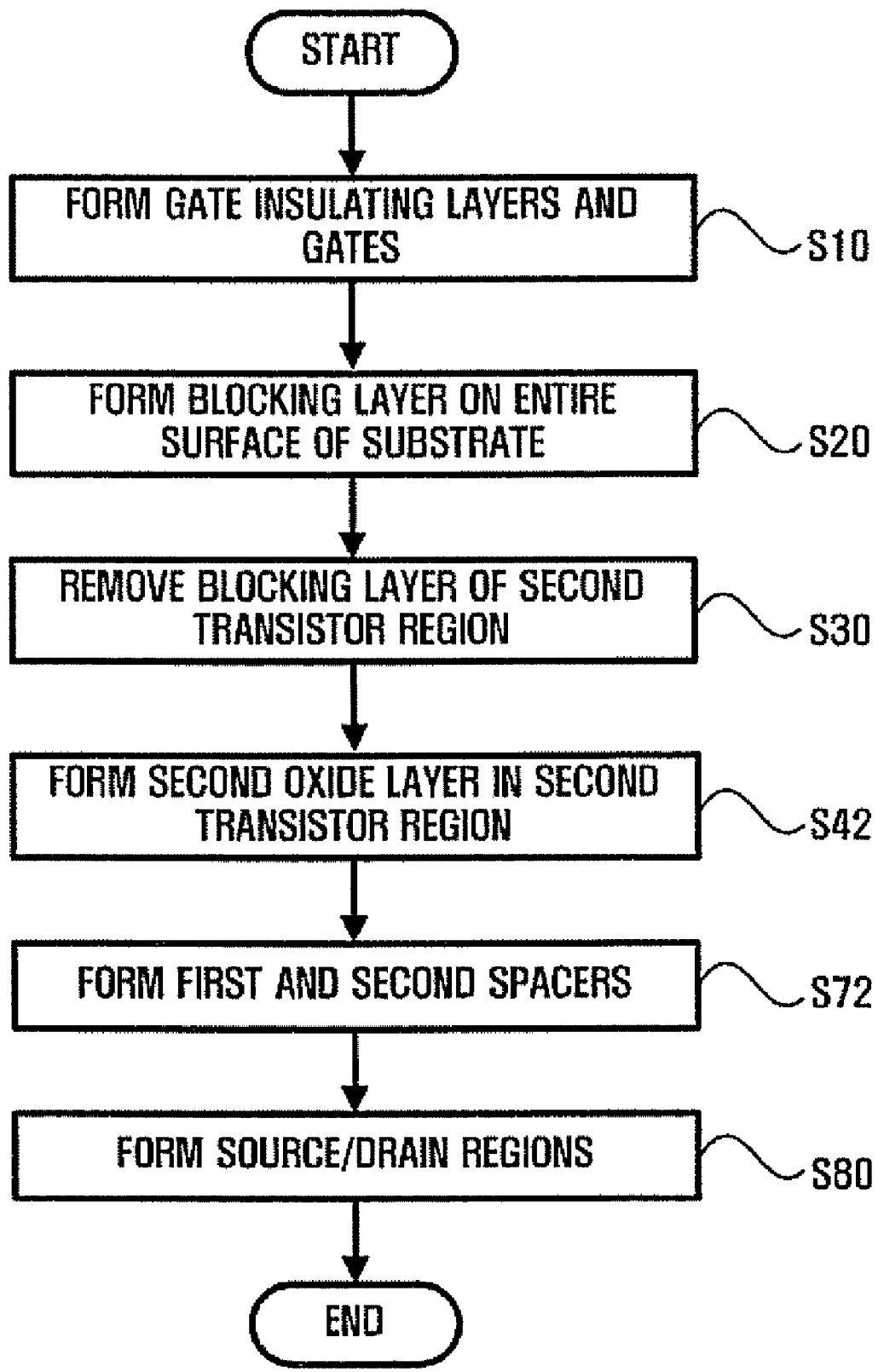
FIG. 10 is a flow diagram illustrating a method of manufacturing a semiconductor integrated circuit device according to a second embodiment of the present invention.
Figure 11:
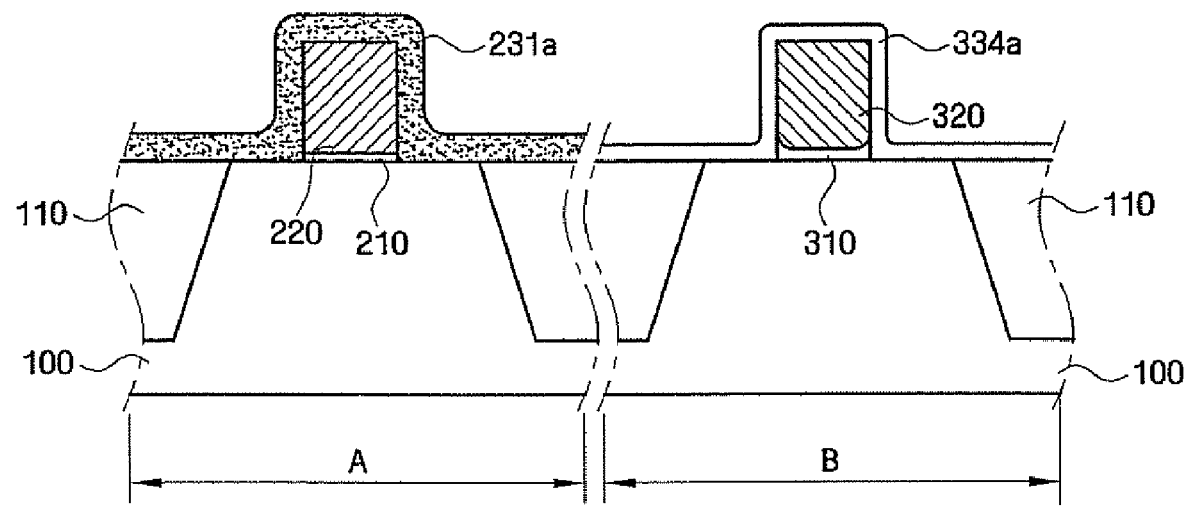
FIGS. 11 and 12 are sequential sectional views illustrating the method of manufacturing the semiconductor integrated circuit device according to the second embodiment of the present invention.
Figure 12:
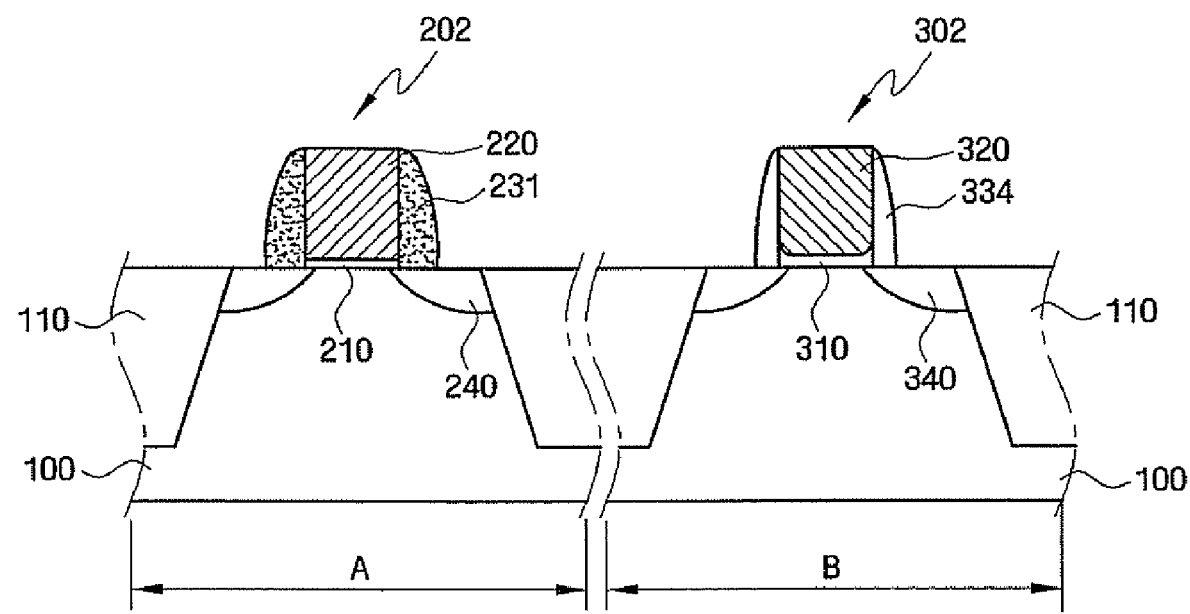

FIG. 10 is a flow diagram illustrating a method of manufacturing the semiconductor integrated circuit device according to the second embodiment of the present invention, and FIGS. 11 and 12 are sequential sectional views illustrating the method of manufacturing the semiconductor integrated circuit device according to the second embodiment of the present invention. Substantially the same functional components as those shown in FIG. 1 through 9 are identified by the same reference numerals, and their repetitive description will be omitted.

The method of manufacturing the semiconductor integrated circuit device according to the second embodiment of the present invention is the same as the method according to the first embodiment of the present invention except that a first spacer 231 of a first transistor region labeled "A" is formed by etching a blocking layer 231a, and a second spacer 334 is formed on a second transistor region labeled "B" by etching a second oxide layer 334a. The method of the second embodiment is the same as that of the first embodiment in terms of operations S10 through S30, and thus only operations subsequent thereto will be described.

Referring to FIGS. 10 and 11, after removing the blocking layer 231a formed on the second transistor region B in operation S30, the second oxide layer 334a is conformally formed on top and lateral surfaces of a second gate 320 of the second transistor region B, on the lateral surface of a second gate insulating layer 310, and on an exposed surface of a substrate 100 in operation S42. In this case, the thickness of the second oxide layer 334a of the illustrative embodiment is greater than the thickness of the second oxide layer (see 331a of FIG. 6) of the first embodiment. For example, the thickness of the second oxide layer 334a may be about 100 Å or more.

Here, the second oxide layer 334a may be formed by performing thermal oxidation at a temperature of about 700~1,000° C. in the course of furnace process. Alternatively, the second oxide layer 334a may be formed by performing rapid thermal oxidation at a temperature of about 800~1,100° C. in the course of rapid thermal process (RTP). In this case, the thermal oxidation may be an oxidation process such as dry oxidation, wet oxidation, or radical oxidation, or a combination of the oxidation process with a nitridation process such as thermal nitridation or plasma nitridation. Here, the thickness of the second oxide layer 334a can be adjusted by controlling a processing duration or a processing gas.

When thermal oxidation is carried out, the second oxide layer 334a is conformally formed on the top and lateral surfaces of the second gate 320, on the lateral surface of the second gate insulating layer 310, and on the exposed surface of the substrate 100. At this time, either end of the second gate insulating layer 310 is thicker than the central portion thereof due to oxidation. That is, either end of the second gate insulating layer 310 has a slightly upwardly rising shape. However, a thickness of the central portion of the second gate insulating layer 310 is maintained at a uniform level.

Next, referring to FIGS. 10, and 12, the blocking layer (see 231a of FIG. 11) of the first transistor region A is anisotropically etched to form the first spacer 231, and the second oxide layer (see 334a of FIG. 11) of the second transistor region B is anisotropically etched to form the second spacer 334 in operation S72. Since the blocking layer 231a is thicker than the second oxide layer 334a, a width of the first spacer 231 is greater than that of the second spacer 334.

Then, source/drain regions 240 and 340 are formed in active regions of the substrate 100 to complete a first transistor 202 and a second transistor 302 in operation S80.

According to the method of the above-illustrated second embodiment of the present invention, when the semiconductor substrate 100 is divided into the first transistor region A requiring no reoxidation process and the second transistor region B requiring a reoxidation process, and only the second transistor region B is subjected to a reoxidation process, the characteristics of transistors can be satisfied according to their own requirements of the transistors. That is, a hot carrier effect can be avoided by forming the second oxide layer 334a in the second transistor region B having the second transistor 302 requiring improved reliability through a reoxidation process, thereby ensuring better reliability.

Alternatively, in order to prevent an increase in the threshold voltage or a decrease in the operating speed due to a reoxidation process, no reoxidation process may be performed on the first transistor region A having the first transistor 202 requiring a fast operating speed and thus requiring no reoxidation process, allowing the transistor 202 of the semiconductor integrated circuit device to be most appropriately tailored to their own requirements.

That is, the semiconductor integrated circuit device having the transistor 202 implemented most suitably according to its own requirements can be manufactured in a more stable, highly efficient manner.

Furthermore, unlike in the method of the first embodiment in which two different spacers 230 and 330 are formed by separately etching the pre-spacer layers (see 230a and 332a of FIG. 7), which is quite a complicated process, in the illustrative embodiment, a spacer of a transistor region is formed by anisotropically etching a blocking layer and a spacer of other transistor region is formed by anisotropically an oxide layer formed by reoxidation. Thus, a manufacturing process is simplified and shortened, thereby ensuring higher productivity Hereinafter, an exemplary semiconductor integrated circuit device according to the second embodiment of the present invention will be described with reference to FIG. 12.

Referring to FIG. 12, a first transistor 202 is present in the first transistor region A, and a second transistor 302 is present in the second transistor region B.

Here, both ends of a second gate insulating layer 310 are thicker than the central portion. That is, both the ends of the second gate insulating layer 310 have a slightly upwardly rising shape. FIG. 12 illustrates that a thickness of the second gate insulating layer 310 is greater than that of a first gate insulating layer 210, but the present invention is not limited to the above-illustrated example. The thicknesses of the first gate insulating layer 210 and the second gate insulating layer 310 may vary according to characteristics of the first transistor 202 and the second transistor 302.

A width of a first spacer 231 of the first transistor 202 is greater than that of a second spacer 334 of the second transistor 302. Here, the first spacer 231 may be a nitride layer or a stack of a nitride layer and an oxide layer, and the second spacer 334 may be an oxide layer.

Hereinafter, a method of manufacturing a semiconductor integrated circuit device according to a third embodiment of the present invention will be described with reference to FIGS. 13 through 19. The method of the third embodiment is substantially the same as that of the first embodiment except that a first oxide layer is formed on a first gate of a first transistor region.

Figure 13:
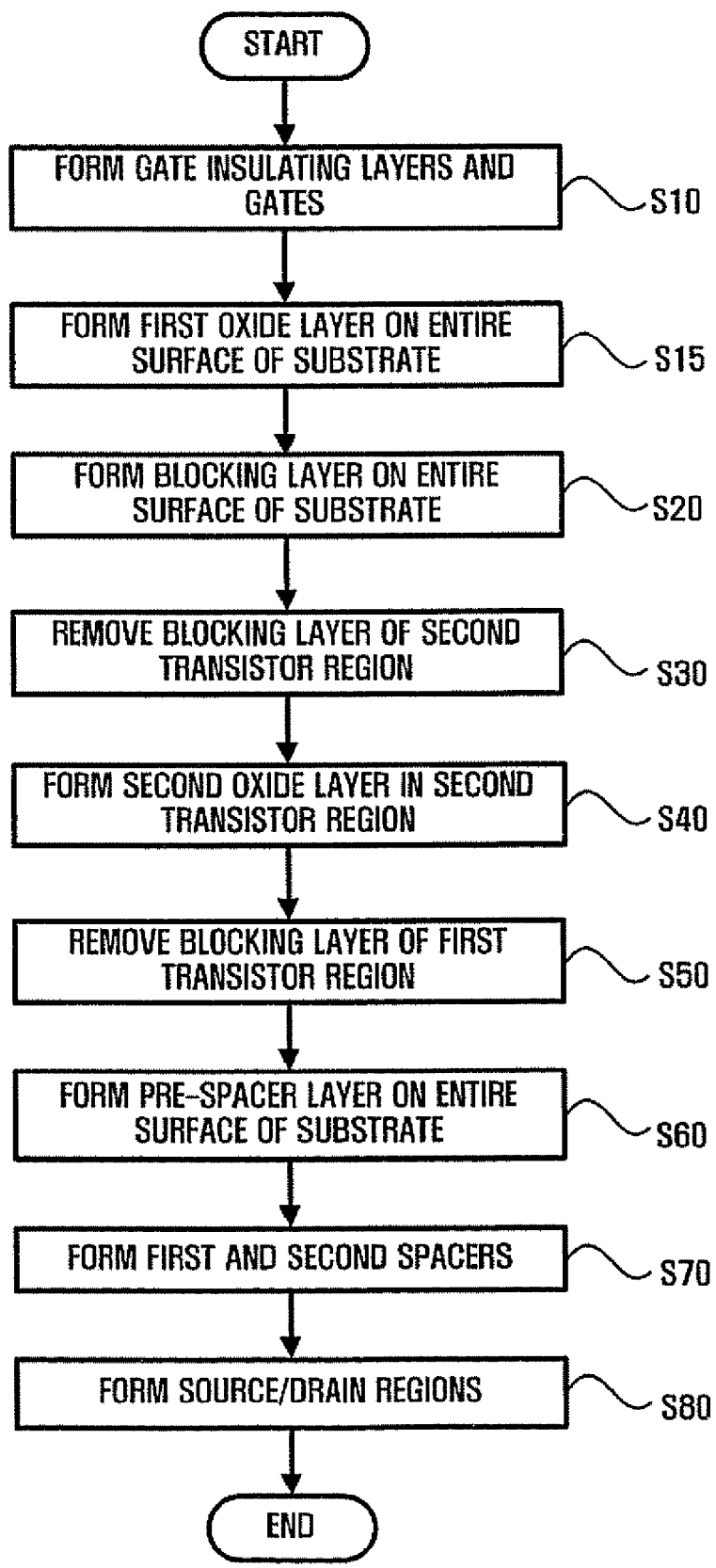
FIG. 13 is a flow diagram illustrating a method of manufacturing a semiconductor integrated circuit device according to a third embodiment of the present invention.

FIG. 13 is a flow diagram illustrating a method of manufacturing a semiconductor integrated circuit device according to a third embodiment of the present invention, and FIGS. 14 through 19 are sequential sectional views illustrating the method of manufacturing the semiconductor integrated circuit device according to the third embodiment of the present invention. Substantially the same functional components as those shown in FIG. 1 through 9 are identified by the same reference numerals, and their repetitive description will be omitted.

The method of manufacturing a semiconductor integrated circuit device according to the third embodiment of the present invention is substantially the same as the method according to the first embodiment of the present invention except that a first oxide layer 232 is formed on a first gate 220 of a first transistor region labeled "A".

First, a first gate insulating layer 210 and a first gate 220 are formed on a top surface of a substrate 100 to be defined as the first transistor region A and a second gate insulating layer 310 and a second gate 320 are formed on a top surface of the substrate 100 to be defined as a second transistor region labeled "B" in operation S110, like in the first embodiment.

Figure 14:
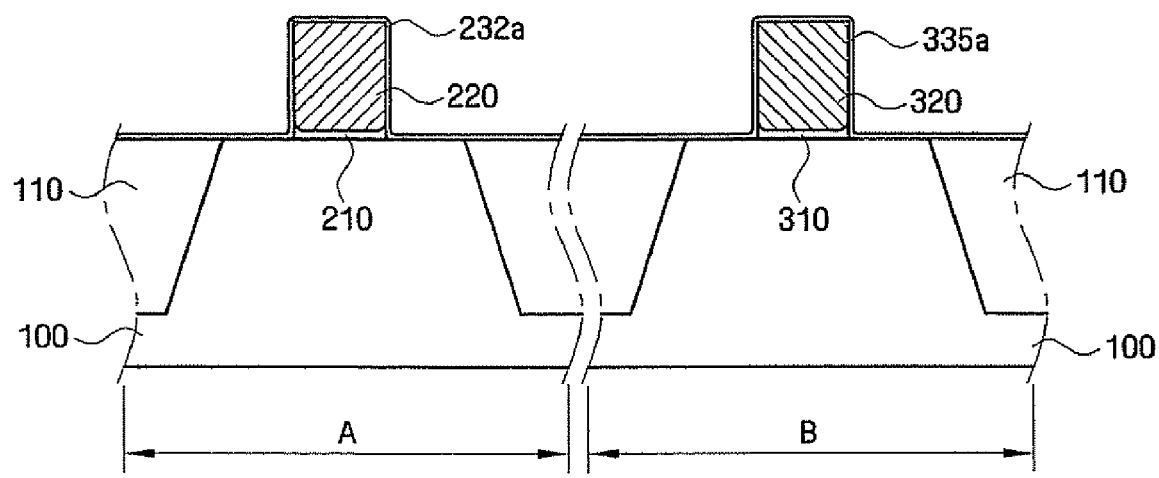
FIGS. 14 through 21 are sequential sectional views illustrating the method of manufacturing the semiconductor integrated circuit device according to the third embodiment of the present invention.

Then, referring to FIGS. 13 and 14, a first oxide layer 232a, 335a is formed over the entire surface of the substrate 100 in operation S15. That is, the first oxide layer 232a, 335 is conformally formed on top and lateral surfaces of the first and second gates 220 and 320 of the first and second transistor regions A and B, on the lateral surfaces of the first and second gate insulating layers 210 and 310, and on an exposed surface of the substrate 100 using a thermal oxidation process.

Here, the first oxide layer 232a, 335a may be formed by thermal oxidation at a temperature of about 700~1,000° C. in the course of furnace process. Alternatively, the first oxide layer 232a, 335a may be formed by performing rapid thermal oxidation at a temperature of about 800~1,100° C. in the course of rapid thermal process (RTP). In this case, the thermal oxidation may be an oxidation process such as dry oxidation, wet oxidation, or radical oxidation, or a combination of the oxidation process with a nitridation process such as thermal nitridation or plasma nitridation. Here, the thickness of the first oxide layer 232a, 335a can be adjusted by controlling a processing duration or a processing gas. A minimum thickness of the first oxide layer 232a, 335a can be adjusted to be not greater than 20 Å.

When thermal oxidation is carried out, the first oxide layer 232a, 335a is conformally formed on the top and lateral surfaces of the first and second gates 220 and 320, on the first and second gate insulating layer 210 and 310, and on the exposed surface of the substrate 100. At this time, both ends of each of the first and second gate insulating layers 210 and 310 are thicker than the central portion thereof due to their oxidation. However, since the first oxide layer 232a, 335a is formed as thinly as possible, extents in which thicknesses of the both ends thereof increase are negligibly small. That is, the thicknesses of the central portions of the first and second gate insulating layers 210 and 310 are maintained at substantially uniform levels.

Figure 15:
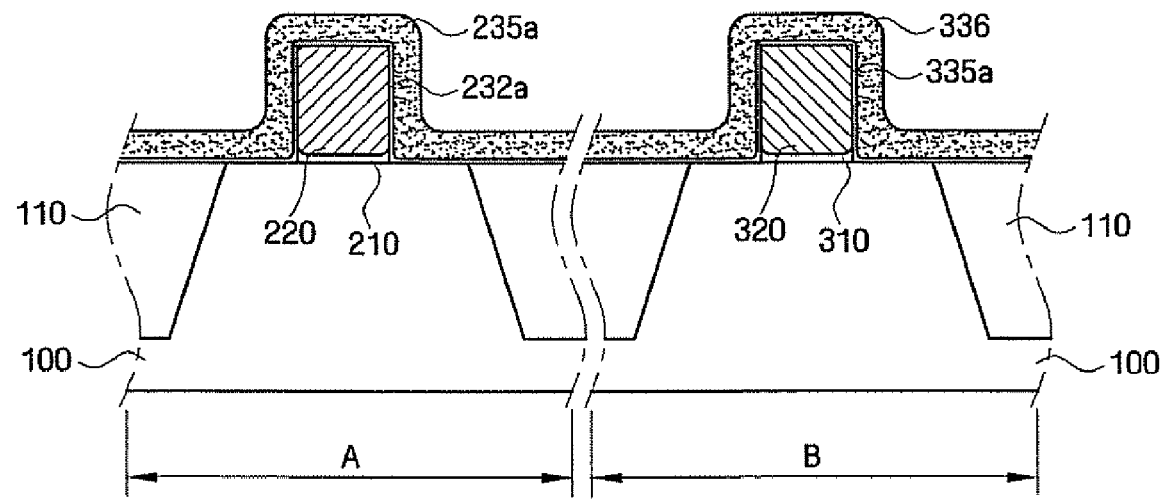

Next, referring to FIGS. 13 and 15, a blocking layer 235a, 336 is formed on an exposed portion of the substrate 100 of the first, second transistor region A, B and on the entire surface of the first and second gates 220 and 320 in operation S20.

Figure 16:
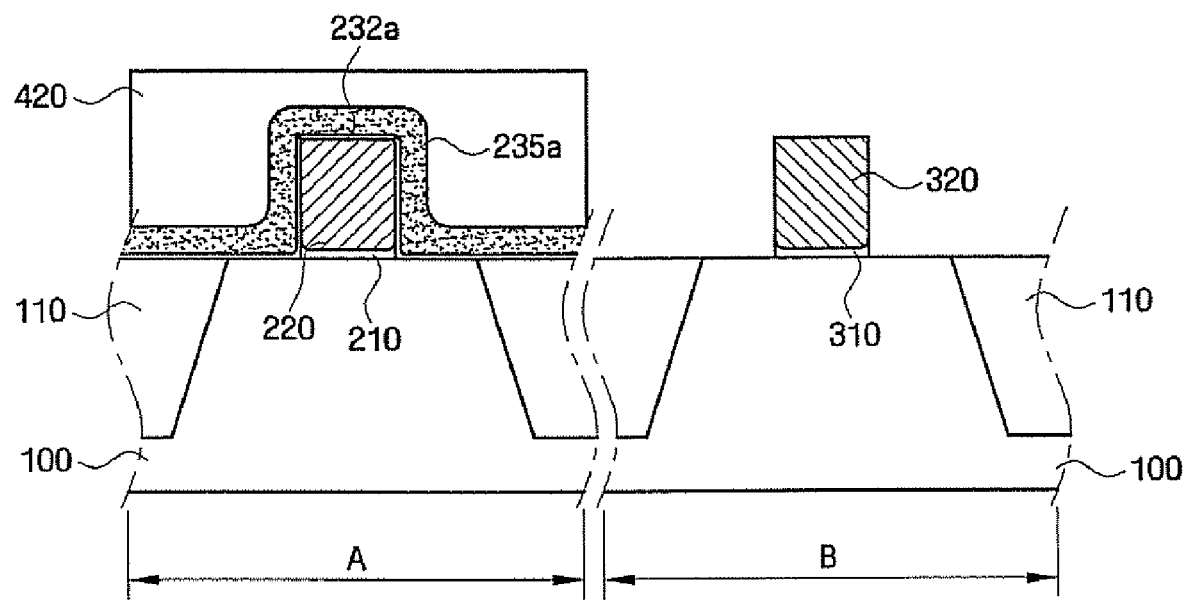

Next, referring to FIGS. 13, and 16, the blocking layer (see 336 of FIG. 7) of the second transistor region B is removed by a photo process in operation S30. Here, the blocking layer 336 of the second transistor region B can be removed using a low-temperature phosphoric acid strip process or a no-bias-ion-etching process.

At this time, the first oxide layer 335a of the second transistor region B may be removed together with the blocking layer 336, or only the blocking layer 336 may be removed. In the latter case, the blocking layer 336 may be removed in a subsequent process, that is, in a spacer etching process. Then, a portion of photoresist 420 of the first transistor region A is removed.

Figure 17:
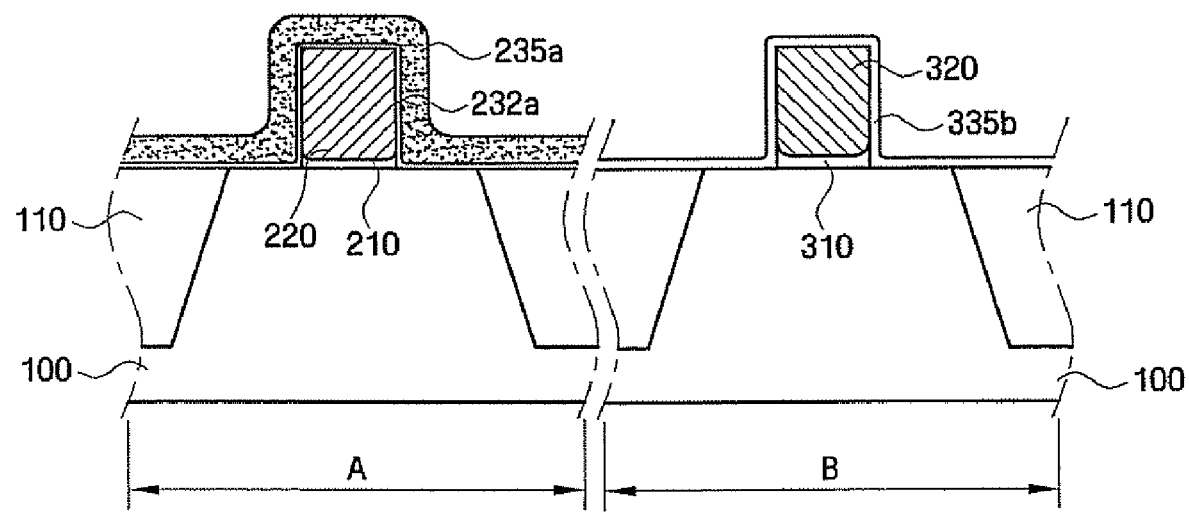

Next, referring to referring to FIGS. 13 and 17, a second oxide layer 335b is conformally formed on the top and lateral surfaces of the second gate 320 of the second transistor region B, on the second gate insulating layer 310, and on an exposed surface of the substrate 100 in operation S40. The second oxide layer 335b may be formed to a thickness of about 20~50 Å, and is thicker than the first oxide layer 232a of the first transistor region A.

When thermal oxidation is carried out, the second oxide layer 335b is conformally formed on the top and lateral surfaces of the second gate 320, on the second gate insulating layer 310, and on the exposed surface of the substrate 100. At this time, oxidation occurs even at either end of the second gate insulating layer 310 so that the thickness of either end of the second gate insulating layer 310 is greater than that of the central portion thereof. That is, either end of the second gate insulating layer 310 has a slightly upwardly rising shape. At this time, a thickness of the central portion of the second gate insulating layer 310 is maintained at a uniform level.

Figure 18:
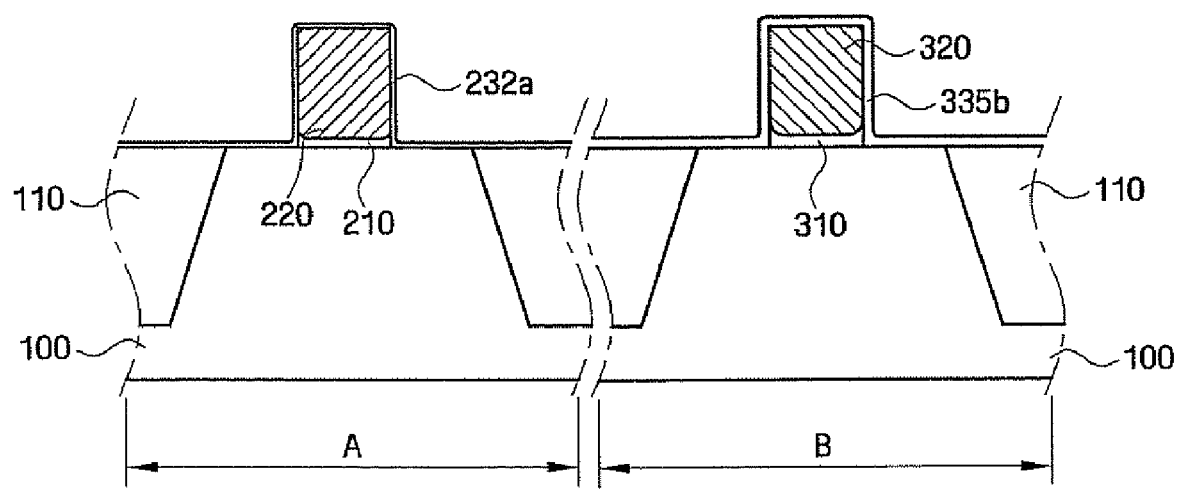

Next, referring to FIGS. 13, 17, and 18, the blocking layer portion 235a of the first transistor region A is removed in operation S50.

Figure 19:
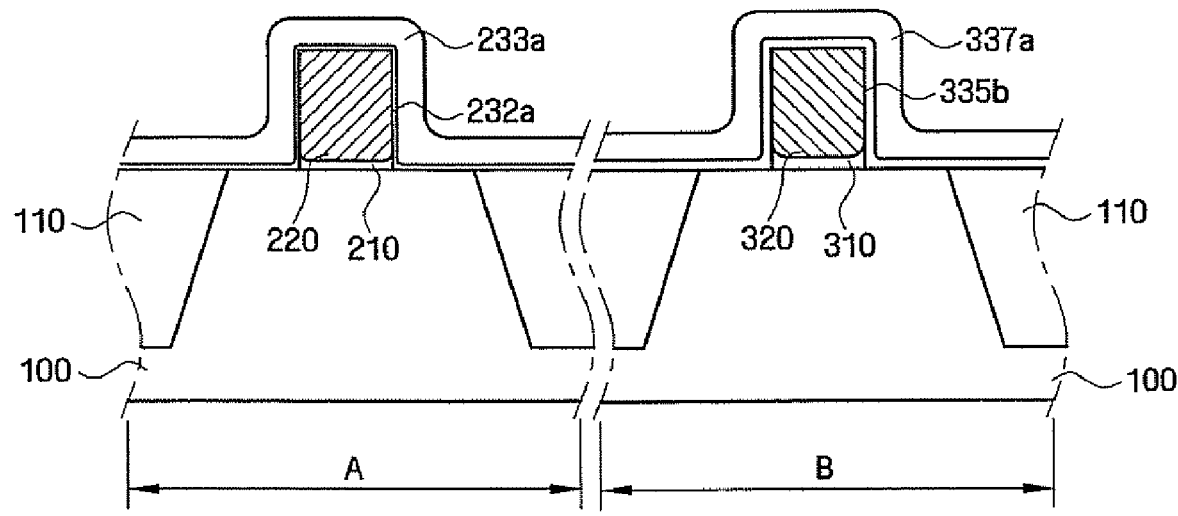

Next, referring to FIGS. 13 and 19, a pre-spacer layer 233a, 337a is formed on the entire surface of the first and second transistor regions A and B in operation S60. The pre-spacer layer 233a, 337a may be, for example, formed by CVD using a nitride layer or an oxide layer.

Figure 20:
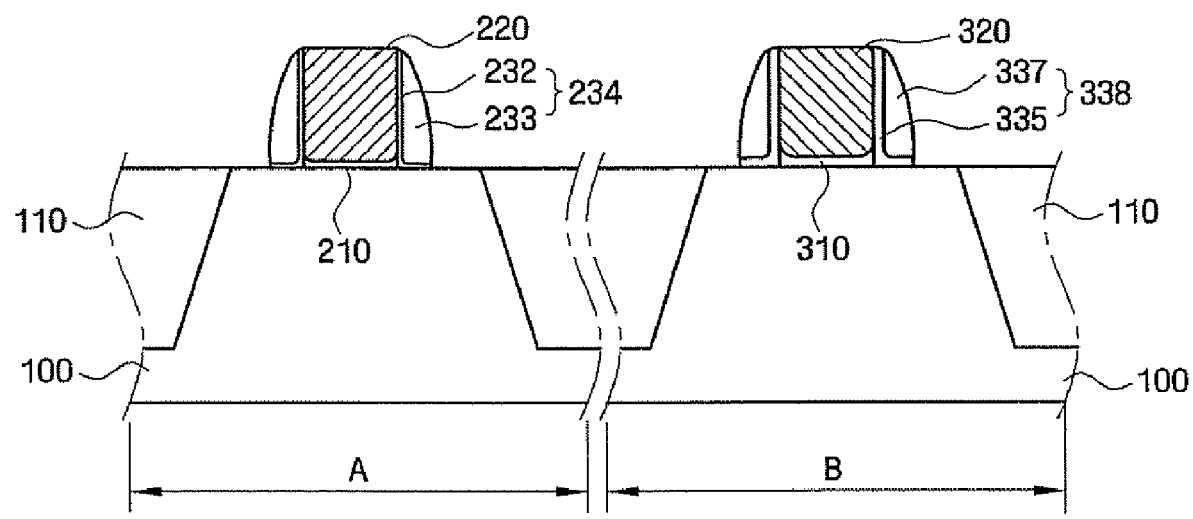

Next, referring to FIGS. 13 and 20, first and second spacers 234 and 338 are formed in operation S70. In detail, referring to FIGS. 19 and 20, the first oxide layer 232a and the pre-spacer layer 233a of the first transistor region A are anisotropically etched to form the first spacer 234, and the second oxide layer 335b and the pre-spacer layer 337a of the second transistor region B are anisotropically etched to form the second spacer 338. Since the second oxide layer 335b is thicker than the first oxide layer portion 232a, a width of the second spacer 338 is greater than that of the first spacer 234.

Figure 21:
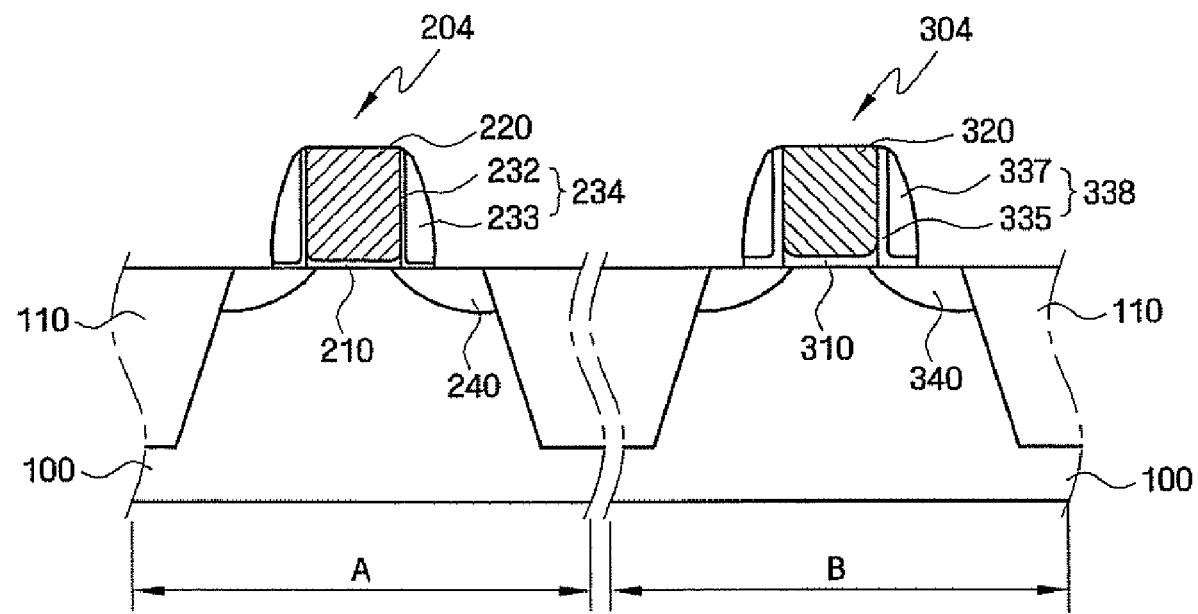

Next, referring to FIGS. 13 and 21, source/drain regions 240 and 340 are formed in active regions of the substrate 100 to complete a first transistor 204 and a second transistor 304 in operation S80.

According to the method of the above-illustrated third embodiment of the present invention, since a thin oxide layer (see 232a, 335a of FIG. 14) is formed by reoxidation prior to forming the blocking layer (see 235a, 336 of FIG. 15), a hot carrier effect can be avoided, thereby improving reliability. Furthermore, since the gate insulating layers 210 and 310 do not undergo a thickness change, an operating speed is not adversely affected. Meanwhile, the second transistor 304 requiring better reliability can have much better reliability by further performing reoxidation.

Thus, transistors can satisfy their own characteristics (reliability, operating speed, etc.) according to their own requirements, allowing transistors of a semiconductor integrated circuit device to be most appropriately tailored to their own requirements.

Hereinafter, a semiconductor integrated circuit device according to the third embodiment of the present invention will be described with reference to FIG. 21.

The semiconductor integrated circuit device of the third embodiment of the present invention has substantially the same structure as that of the first embodiment of the present invention shown in FIG. 21 except those given below.

Referring to FIG. 21, a first transistor 204 is present in a first transistor region A, and a second transistor 304 is present in a second transistor region B.

Both ends of first and second gate insulating layers 210 and 310 of the first and second transistors 204 and 304 are thicker than the central portions. That is, both the ends of the first and second gate insulating layers 210 and 310 have a slightly upwardly rising shape. At this time, a thickness chance in both ends of the first gate insulating layer 210 is much smaller than that of the second gate insulating layer 310.

Each of a first spacer 236 of the first transistor 204 and a second spacer 339 of the second transistor 304 has a double-layered structure comprised of an oxide layer and a nitride/oxide layer. The first and second spacers 236 and 339 include first and second oxide layers 232a and 339a, respectively, which are formed thinly on the lateral surfaces of first and second gates 220 and 320 and on a top surface of a substrate 100. At this time, the thickness of the second oxide layer 339a is greater than that of the first oxide layer 232a. Thus, a width of the second spacer 338 is greater than that of the first spacer 234.

Hereinafter, a method of manufacturing a semiconductor integrated circuit device according to a fourth embodiment of the present invention will be described with reference to FIGS. 22 through 24.

Figure 22:
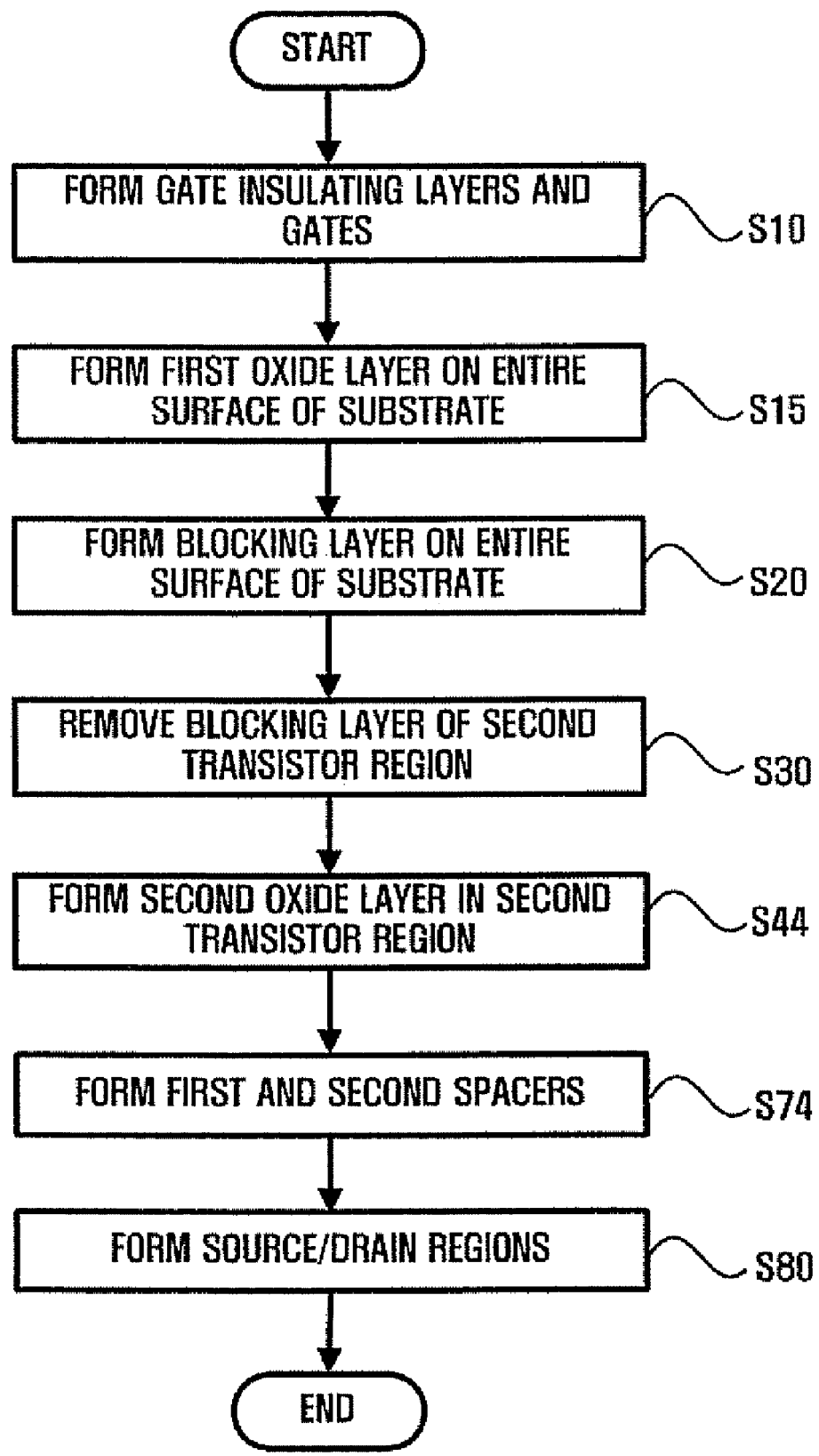
FIG. 22 is a flow diagram illustrating a method of manufacturing a semiconductor integrated circuit device according to a fourth embodiment of the present invention.
Figure 23:
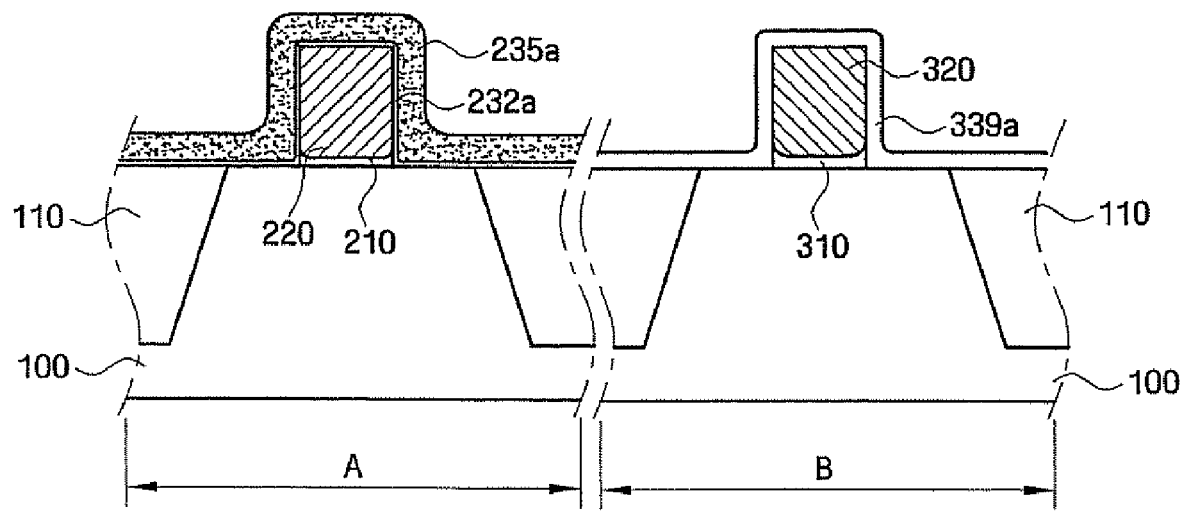
FIGS. 23 and 24 are sequential sectional views illustrating the method of manufacturing the semiconductor integrated circuit device according to the fourth embodiment of the present invention.
Figure 24:
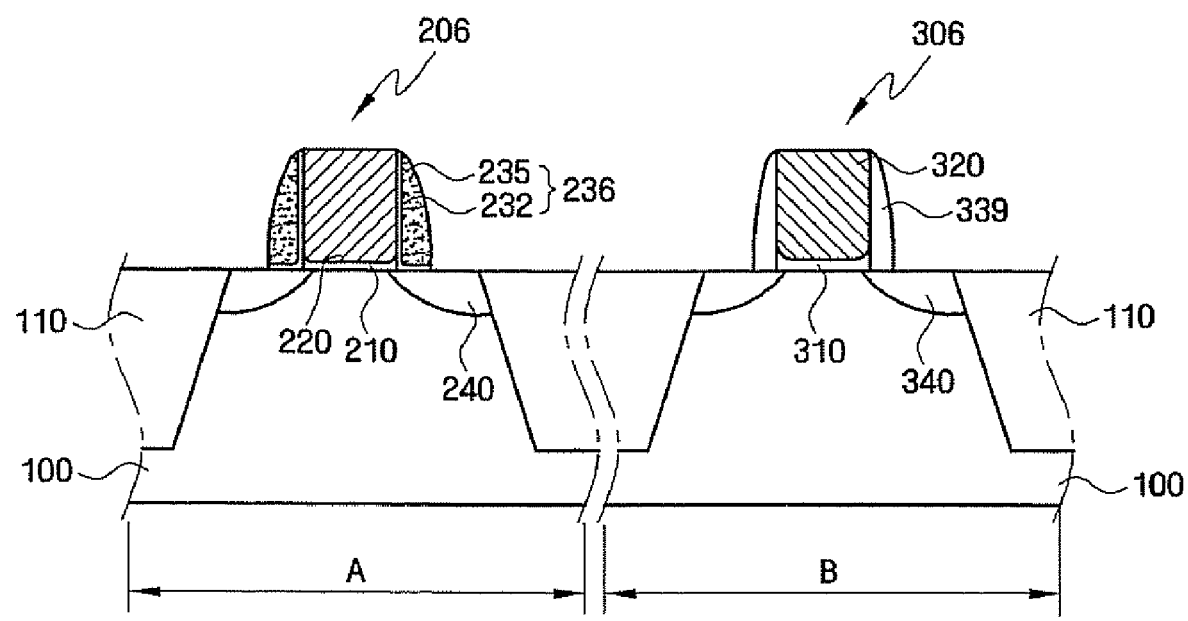

FIG. 22 is a flow diagram illustrating a method of manufacturing the semiconductor integrated circuit device according to the fourth embodiment of the present invention, and FIGS. 23 and 24 are sequential sectional views illustrating the method of manufacturing the semiconductor integrated circuit device according to the fourth embodiment of the present invention.

Substantially the same functional components as those shown in FIG. 13 through 21 are identified by the same reference numerals, and their repetitive description will be omitted.

The method of the fourth embodiment of the present invention is substantially the same as the method of the third embodiment of the present invention except that a first spacer 236 is formed in a first transistor region A by etching a first oxide layer 232a and a blocking layer 235a, and a second spacer 339 is formed in a second transistor region B by etching the second oxide layer 339a. The method of the fourth embodiment is the same as that of the third embodiment in terms of operations S10 through S30, and thus only operations subsequent thereto will be described.

Referring to FIGS. 22 and 23, after removing the blocking layer (see 336 of FIG. 15) formed on the second transistor region B in operation S30, the second oxide layer 339a is conformally formed on top and lateral surfaces of the second gate 320 of the second transistor region B, on the second gate insulating layer 310, and on the exposed surface of the substrate 100 in operation S44. In this case, the thickness of the second oxide layer 339a of the illustrative embodiment is greater than the thickness of the second oxide layer (see 335b of FIG. 17) of the third embodiment. For example, the thickness of the second oxide layer 339a may be about 100 Å or more.

Here, the second oxide layer 339a may be formed by performing thermal oxidation at a temperature of about 700·1,000° C. in the course of furnace process. Alternatively, the second oxide layer 339a may be formed by performing rapid thermal oxidation at a temperature of about 800~1,100° C. in the course of rapid thermal process (RTP). In this case, the thermal oxidation may be an oxidation process such as dry oxidation, wet oxidation, or radical oxidation, or a combination of the oxidation process with a nitridation process such as thermal nitridation or plasma nitridation. Here, the thickness of the second oxide layer 339a can be adjusted by controlling a processing duration or a processing gas.

When thermal oxidation is carried out, the second oxide layer 339a is conformally formed on the top and lateral surfaces of the second gate 320, on the second gate insulating layer 310, and on the exposed surface of the substrate 100. At this time, either end of the second gate insulating layer 310 is thicker than the central portion thereof due to oxidation. That is, either end of the second gate insulating layer 310 has a slightly upwardly rising shape. The central portion of the second gate insulating layer 310 has a uniform film thickness.

Referring to FIGS. 22 and 24, first and second spacers 236 and 339 are formed in operation S74. In detail, the first oxide layer (see 232a of FIG. 23) and the pre-spacer layer (see 235a of FIG. 23) of the first transistor region A are anisotropically etched to form the first spacer 236, and the second oxide layer 339a of the second transistor region B is anisotropically etched to form the second spacer 339. Here, since the blocking layer 235a is thicker than the second oxide layer 339a, a width of the first spacer 236 is greater than that of the second spacer 339.

In operation S80, source/drain regions 240 and 340 are formed in active regions of the substrate 100 to complete a first transistor 206 and a second transistor 306.

According to the method of the above-illustrated second embodiment of the present invention, to avoid a hot carrier effect, an oxide layer is formed in a transistor region having transistors requiring better reliability through a reoxidation process, thereby ensuring enhanced reliability.

Alternatively, to prevent an increase in the threshold voltage or a decrease in the operating speed due to a reoxidation process, no reoxidation process is performed in a transistor region having transistors requiring a fast operating speed requiring no reoxidation process. Therefore, individual transistors can be suitably formed according to their own requirements, allowing transistors of a semiconductor integrated circuit device to be most appropriately tailored to their own requirements. That is, the semiconductor integrated circuit device having individual transistors implemented most suitably according to their own requirements can be manufactured in a more stable, highly efficient manner.

Furthermore, unlike in the method of the third embodiment in which the spacers 234 and 338 are formed by separately etching the pre-spacer layers 233a and 337a, as shown in FIG. 19, which is quite a complicated process, in the illustrative embodiment, the blocking layer 235a of the first transistor region A is anisotropically etched to form the first spacer 236 and the second oxide layer 339a of the second transistor region B is anisotropically etched to form the spacer 339, thereby simplifying the process, shortening a processing duration and ensuring higher productivity.

Hereinafter, the semiconductor integrated circuit device according to the fourth embodiment of the present invention will be described with reference to FIG. 24.

Referring to FIG. 24, the first transistor 206 is present in the first transistor region A, and the second transistor 306 is present in the second transistor region B. A width of the first spacer 236 of the first transistor 206 is greater than that of the second spacer 339 of the second transistor 306.

Here, the first spacer 236 has a double-layered structure comprised of an oxide layer and a nitride/oxide layer, and the second spacer 339 has a single-layered structure such as an oxide layer.

As described above, semiconductor integrated circuit devices and methods for fabricating the same according to the present invention provides at least the following advantages.

First, according to methods of manufacturing semiconductor integrated circuit devices and semiconductor integrated circuit devices manufactured by the methods of the present invention, only a selected transistor can be subjected to a reoxidation process. Therefore, transistors can satisfy their own characteristics according to their own requirements, allowing transistors of a semiconductor integrated circuit device to be most appropriately tailored to their own requirements. That is, the semiconductor integrated circuit device having individual transistors implemented most suitably according to their own requirements can be manufactured in a more stable, highly efficient manner.

Second, even when a reoxidation process is performed, there is no a significant change in the thickness of a gate insulating layer, so that a reduction in the operating speed due to an increase in the thickness of the gate insulating layer may be avoidable.

Third, since a spacer is formed without a step of depositing a pre-spacer, the process can be simplified, which is cost-effective, thereby ultimately increasing the productivity.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, it is to be understood that the above-described embodiments have been provided only in a descriptive sense and will not be construed as placing any limitation on the scope of the invention.

What is claimed is:

1. A method of manufacturing a semiconductor integrated circuit device, the method comprising:
   providing a semiconductor substrate comprising a first transistor region having a stacked structure of a first gate insulating layer and a first gate and a second transistor region having a stacked structure of a second gate insulating layer and a second gate;
   forming a blocking layer in the first transistor region; then
   conformally forming a second oxide layer on lateral surfaces of the second gate insulating layer and the second gate and on an exposed surface of the semiconductor substrate by performing oxidation on the second transistor region using the blocking layer as an oxidation mask to prevent oxidation of the first transistor region, then;
   removing the blocking layer of the first transistor region; then
   forming a pre-spacer layer on the entire surface of the semiconductor substrate;
   forming a first spacer by anisotropically etching the pre-spacer layer of the first transistor region and forming a second spacer by anisotropically etching the second oxide layer and the pre-spacer layer of the second transistor region; and
   forming source/drain regions in the semiconductor substrate to complete a first transistor and a second transistor.

2. The method of claim 1, wherein both ends of the second gate insulating layer are thicker than a central portion of the second gate insulating layer.

3. The method of claim 1, wherein the forming of the blocking layer in the first transistor region comprises:
   forming a blocking layer on the entire surface of the semiconductor substrate; and
   removing the blocking layer of the second transistor region using a low-temperature phosphoric acid strip process or a no-bias-ion-etching process.

4. The method of claim 1, wherein the blocking layer is a nitride layer or a stack of a nitride layer and an oxide layer.

5. The method of claim 1, wherein the pre-spacer layer is a nitride layer or an oxide layer.

6. The method of claim 3, further comprising forming a first oxide layer on the entire surface of the semiconductor substrate prior to forming the blocking layer in the first transistor region.

7. The method of claim 6, wherein in the forming of the first spacer and the second spacer by anisotropically etching the second oxide layer and the pre-spacer layer, the first oxide layer is anisotropically etched.

8. The method of claim 6, wherein the first oxide layer of the second transistor region is removed when removing the blocking layer of the second transistor region.

* * * * *